United States Patent
Chang et al.

(10) Patent No.: US 7,855,135 B2
(45) Date of Patent: Dec. 21, 2010

(54) METHOD TO REDUCE PARASTIC CAPACITANCE IN A METAL HIGH DIELECTRIC CONSTANT (MHK) TRANSISTOR

(75) Inventors: Leland Chang, New York, NY (US); Isaac Lauer, White Plains, NY (US); Renee T. Mo, Briarcliff Manor, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/539,860

(22) Filed: Aug. 12, 2009

(65) Prior Publication Data

US 2009/0298275 A1 Dec. 3, 2009

Related U.S. Application Data

(62) Division of application No. 11/852,359, filed on Sep. 10, 2007.

(51) Int. Cl.
*H01L 21/3205* (2006.01)
*H01L 21/4763* (2006.01)
*H01L 21/336* (2006.01)

(52) U.S. Cl. .............. 438/596; 438/184; 438/230; 438/267; 438/303; 438/304; 438/446; 438/592; 438/595

(58) Field of Classification Search ............... 438/595, 438/596
See application file for complete search history.

(56) References Cited

U.S. PATENT DOCUMENTS

| | | | | |
|---|---|---|---|---|
| 5,773,331 | A * | 6/1998 | Solomon et al. | 438/164 |
| 5,804,499 | A | 9/1998 | Dehm et al. | 438/592 |
| 6,448,613 | B1 | 9/2002 | Yu | 257/344 |
| 6,501,134 | B1 | 12/2002 | Knvokapic | 257/350 |
| 7,012,027 | B2 | 3/2006 | Perng et al. | 438/710 |
| 7,164,189 | B2 | 1/2007 | Huang et al. | 257/632 |
| 2006/0022270 | A1 | 2/2006 | Boyd et al. | 257/351 |

* cited by examiner

*Primary Examiner*—N Drew Richards
*Assistant Examiner*—Michael Jung
(74) *Attorney, Agent, or Firm*—Harrington & Smith

(57) ABSTRACT

A method is disclosed to reduce parasitic capacitance in a metal high dielectric constant (MHK) transistor. The method includes forming a MHK gate stack upon a substrate, the MHK gate stack having a bottom layer of high dielectric constant material, a middle layer of metal, and a top layer of one of amorphous silicon or polycrystalline silicon. The method further forms a depleted sidewall layer on sidewalls of the MHK gate stack so as to overlie the middle layer and the top layer, and not the bottom layer. The depleted sidewall layer is one of amorphous silicon or polycrystalline silicon. The method further forms an offset spacer layer over the depleted sidewall layer and over exposed surfaces of the bottom layer.

11 Claims, 4 Drawing Sheets

(extension and halos)
Mask P, implant NFET
Mask N, implant PFET

Deposit and etch final spacer (ie. Nitride or oxide, PECVD), typically 2-10 nm wide Mask P, implant NFET ▨
(As or P)
Mask N, implant PFET ▧
(B or BF2)
(Deep diffusions)

METHOD TO REDUCE PARASITIC CAPACITANCE IN A METAL HIGH DIELECTRIC CONSTANT (MHK) TRANSISTOR

CROSS REFERENCE TO RELATED APPLICATION

This is a divisional patent application of U.S. patent application Ser. No. 11/852,359 filed Sep. 10, 2007, the disclosure of which is incorporated by reference in its entirety.

TECHNICAL FIELD

The exemplary embodiments of this invention relate generally to semiconductor devices and methods to fabricate them and, more specifically, exemplary embodiments of this invention relate to a class of devices known as metal high dielectric constant (high-k or MHK) transistors.

BACKGROUND

MHK transistors are experiencing extremely active development in the industry. One observed problem relates to the presence of an elevated outer fringe capacitance (Cof), on the order of 40-80 aF/μm. The elevated value of Cof is of concern, in that it at least impairs high frequency operation of the MHK transistor.

In U.S. Pat. No. 7,164,189 B2 Chien-Chao Huang et al. describe a method that includes providing a semiconductor substrate including a polysilicon or a metal gate structure including at least one overlying hardmask layer; forming spacers selected from the group consisting of oxide/nitride and oxide/nitride/oxide layers adjacent the polysilicon or metal gate structure; removing the at least one overlying hardmask layer to expose the polysilicon or metal gate structure; carrying out an ion implant process; carrying out at least one of a wet and dry etching process to reduce the width of the spacers; and, forming at least one dielectric layer over the polysilicon or metal gate structure and spacers in one of tensile and compressive stress.

In U.S. Pat. No. 6,448,613 B1 Bin Yu describes a field effect transistor that is fabricated to have a drain overlap and a source overlap to minimize series resistance between the gate and the drain and between the gate and the source of the field effect transistor. The parasitic Miller capacitance formed by the drain overlap and the source overlap is said to be reduced by forming a depletion region at the sidewalls of the gate structure of the field effect transistor. The depletion region is formed by counter-doping the sidewalls of the gate structure. The sidewalls of the gate structure at the drain side and the source side of the field effect transistor are doped with a type of dopant that is opposite to the type of dopant within the gate structure. Such dopant at the sidewalls of the gate structure forms a respective depletion region from the sidewall into approximately the edge of the drain overlap and source overlap that extends under the gate structure to reduce the parasitic Miller capacitance formed by the drain overlap and the source overlap.

At least one drawback of this latter approach is that it does not address the reduction of parasitic Miller capacitance when metal-like materials (such as TiN) are used.

SUMMARY

The foregoing and other problems are overcome, and other advantages are realized, in accordance with the exemplary embodiments of this invention.

In a first aspect thereof the exemplary embodiments of this invention provide a method to form a metal high dielectric constant (MHK) transistor, where the method includes providing a MHK stack disposed on a substrate, the MHK stack comprising a layer of high dielectric constant material and an overlying layer comprised of a metal, the MHK stack having an overlying layer comprised of silicon; selectively removing only the layer comprised of silicon and the layer comprised of metal, without removing the layer of high dielectric constant material, to form an upstanding portion of a MHK gate structure comprised of a portion of the layer comprised of silicon, an underlying portion of the layer comprised of metal, and an overlying portion of the layer comprised of silicon; forming a sidewall layer comprised of silicon on sidewalls of the upstanding portion of the MHK gate structure; removing that portion of the layer of high dielectric constant material than does not underlie the upstanding portion of the MHK gate structure; and forming an offset spacer layer over the sidewall layer and over exposed surfaces of a remaining portion of the layer of high dielectric constant material that underlies the upstanding portion of the MHK gate structure.

In a further aspect thereof the exemplary embodiments of this invention provide a MHK transistor that comprises a substrate; a MHK gate structure disposed on the substrate between a source region and a drain region, the MHK gate structure comprising a layer of high dielectric constant material and an overlying layer comprised of a metal, the MHK gate structure having an overlying layer comprised of silicon, where a lateral extent of the layer of high dielectric constant material is greater than a lateral extent of the overlying layer of metal; a sidewall layer comprised of silicon disposed on sidewalls of the MHK gate structure to cover the layer comprised of metal and the overlying layer comprised of silicon, said sidewall layer also being disposed over a top surface of the underlying layer of high dielectric constant material; and an offset spacer layer disposed over the layer comprised of silicon and over exposed portions of the layer of high dielectric constant material.

In another aspect thereof the exemplary embodiments of this invention provide a method to reduce parasitic capacitance in a metal high dielectric constant (MHK) transistor. The method includes forming a MHK gate stack upon a substrate, the MHK gate stack comprising a bottom layer comprised of high dielectric constant material, a middle layer comprised of metal, and a top layer comprised of one of amorphous silicon or polycrystalline silicon; forming a depleted sidewall layer on sidewalls of the MHK gate stack so as to overlie the middle layer and the top layer, and not the bottom layer, said depleted sidewall layer comprised of one of amorphous silicon or polycrystalline silicon; and forming an offset spacer layer over the depleted sidewall layer and over exposed surfaces of the bottom layer.

BRIEF DESCRIPTION OF THE DRAWINGS

The foregoing and other aspects of the embodiments of this invention are made more evident in the following Detailed Description, when read in conjunction with the attached Drawing Figures, wherein.

DETAILED DESCRIPTION

Although well-known to those skilled in the art, certain abbreviations that appear in the ensuing description and/or in the Figures are defined as follows:
BOX buried oxide
CMOS complementary metal-oxide semiconductor
CVD chemical vapor deposition
FET field effect transistor
$HfO_2$ hafnium oxide
MLD multi-layer deposition
PECVD plasma enhanced chemical vapor deposition
PR photoresist
RIE reactive ion etch
RTA rapid thermal anneal
SOI silicon on insulator
STI shallow trench isolation
TiN titanium nitride
poly polycrystalline silicon
Si silicon The inventors have realized that, as compared to conventional poly-gated FETs, the origin of the increased Cof is due to a lack of sidewall depletion in the metal gate. This added capacitance adds to the Miller capacitance (Cmiller) and thus has a tangible performance impact. It can be determined that there can exist an approximately a 3.2% per 10 aF/μm of Cof increase (assuming that N-type FETS (NFETs) and P-type FETs (PFETs) track together in Cof).

The exemplary embodiments of this invention overcome this problem by providing a silicon sidewall spacer, in combination with a MHK gate, to reduce Cof and thus also reduce Cmiller.

The use of exemplary embodiments of this invention creates a structure with a thin-polysilicon or amorphous silicon sidewall that gates the FET extension region. Since the gate sidewall is made to be silicon, the sidewall depletion that occurs beneficially lowers the C of to similar levels as in poly-silicon gated FETs. Additionally, since primarily only the extension regions are gated with silicon (and therefore a relaxed EOT is present), the scaled EOT in the MHK transistor channel is maintained.

In general, the overall fabrication scheme described below may be standard until the gate stack etch. As in a normal process flow the metal etch stops on the hi-k material (such as on a layer of $HfO_2$). At this step, in accordance with the exemplary embodiments of this invention, deposition occurs of polysilicon (either CVD or PECVD) in the thickness range of about 10-20 nm. Then, using RIE, a thin poly-silicon sidewall gate is formed that is disposed largely over the device extension region. Then, processing may continue as in a conventional MHK process flow, such as by removing the hi-k material and growing MLD nitride and subsequent diffusion spacers.

FIGS. 1A through 1G are each an enlarged cross-sectional view of a semiconductor-based structure and depict metal gate process flow in accordance with the exemplary embodiments of this invention. In these Figures an NFET and a PFET are shown arranged in a side-by-side manner for convenience of description, and not as a limitation upon the practice of the exemplary embodiments of this invention.

Figure 1A:
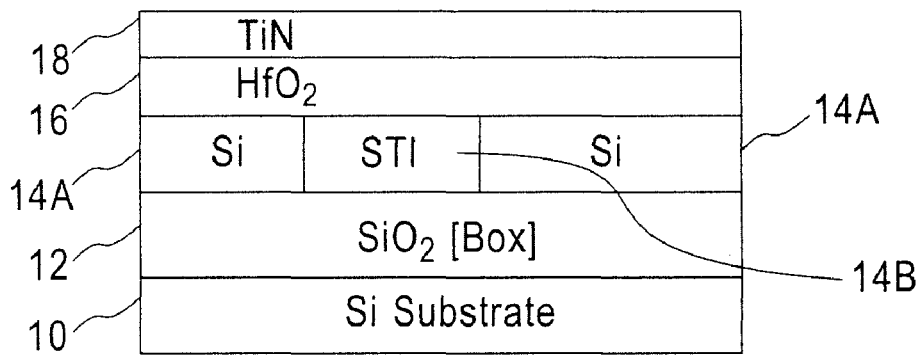
FIGS. 1A through 1G are each an enlarged cross-sectional view of a semiconductor-based structure and depict metal gate process flow in accordance with the exemplary embodiments of this invention.

FIG. 1A shows a Si substrate 10 having an overlying oxide layer 12 (e.g., 3 μm) and overlying Si and STI regions 14A, 14B. A conventional $HfO_2$/TiN deposition may provide gate stack layers 16 and 18, respectively. The $HfO_2$ layer 16 may be considered as the high-k layer (e.g., k in a range of about 20-25, as compared to 3.9 for $SiO_2$) and may have a thickness in a range of about 1-3 nm. The TiN layer 18 may be considered as the metal (or metal-like layer) and may have a thickness of about 10 nm. Layers 16 and 18 together form the (as yet unpatterned) MHK gate stack. This initial structure may represent a standard SOI (or without BOX bulk) CMOS with a MHK gate stack.

Note that the exemplary embodiments of this invention are not limited for use with $HfO_2$ as the high-k material, and other metal oxide-based materials may be used as well, such as a uniform or a composite layer comprised of one or more of $Ta_2O_5$, $TiO_2$, $Al_2O_3$, $Y_2O_3$ and $La_2O_5$. Materials other than TiN that may be used for the metal-containing layer 18 include, but need not be limited to, one or more of Ta, TaN, TaCN, TaSiN, TaSi, AlN, W and Mo.

Figure 1B:
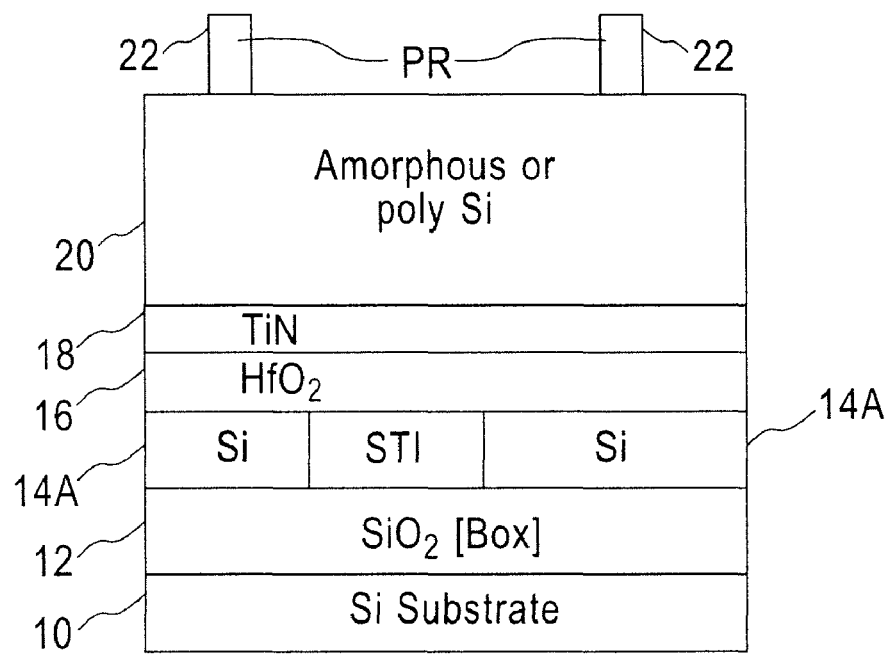

FIG. 1B shows the deposition of an amorphous Si or a poly Si layer 20, which may have a thickness in a range of about 30-100 nm, and subsequent deposition and patterning of PR to form PR regions 22. Each PR region 22 is located where a device gate is desired to be formed.

Figure 1C:
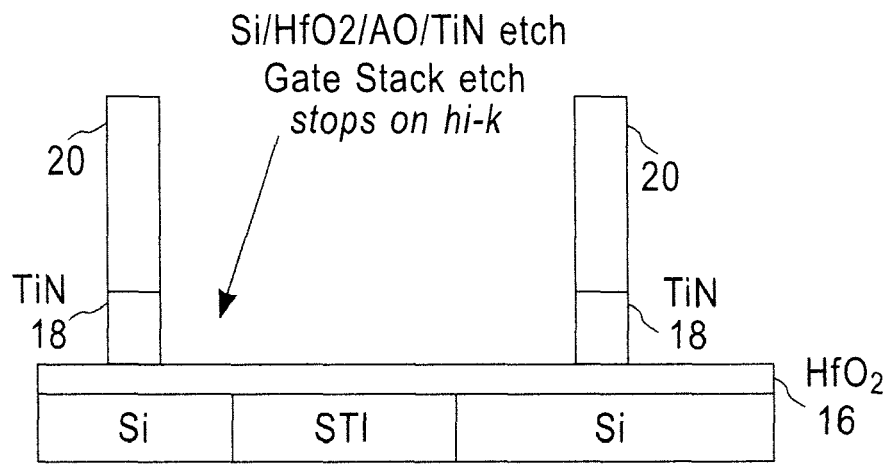

FIG. 1C, depicted without the underlying Si substrate 10 and oxide layer 12 for simplicity, shows the result of a gate stack etch (which also removes the PR regions 22). In accordance with an aspect of this invention, the gate stack etch stops at the high-k layer 16 of $HfO_2$.

Figure 1D:
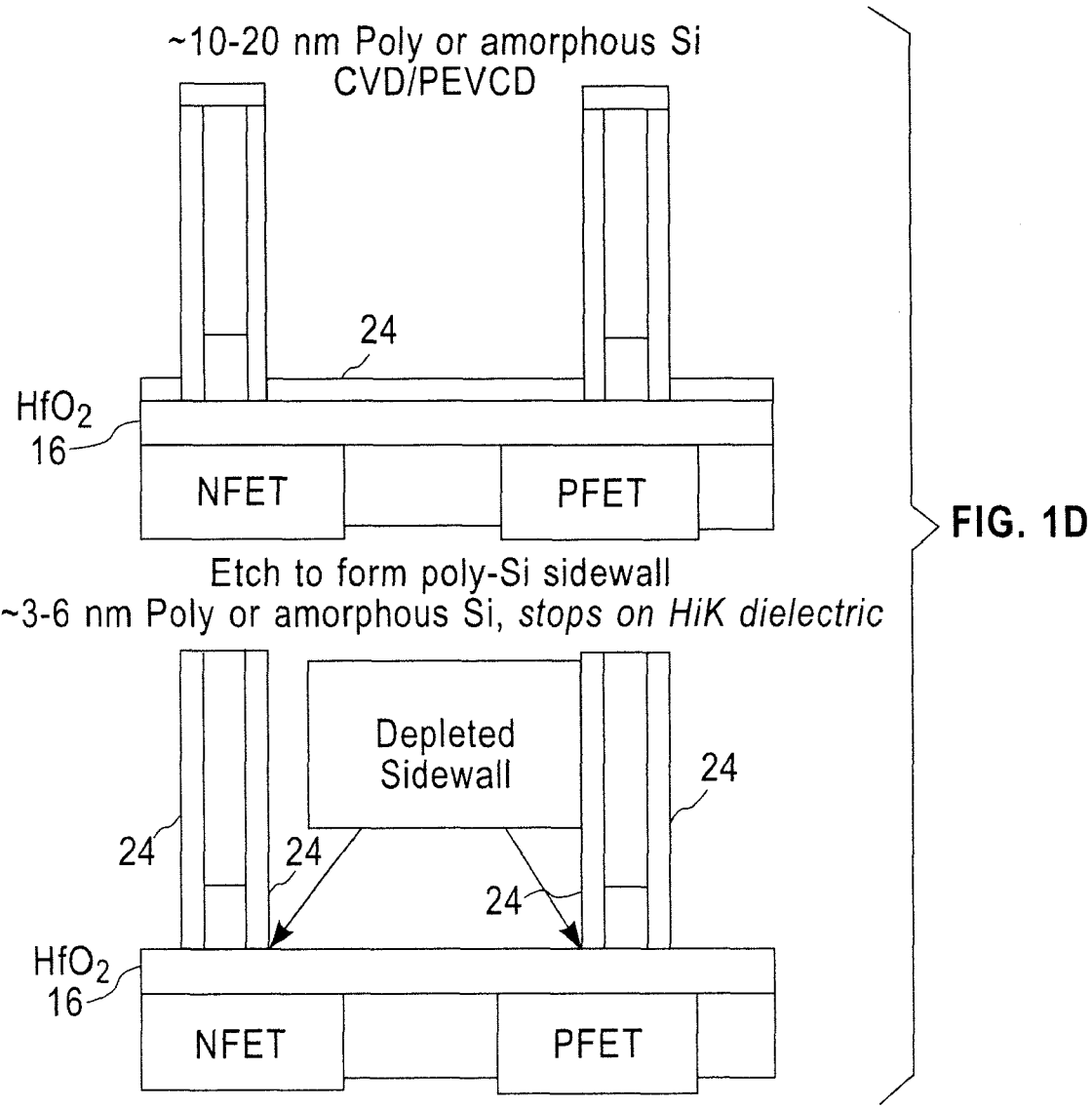

FIG. 1D shows a blanket deposition by, for example, CVD or PECVD of a layer 24 of amorphous Si or polycrystalline (poly) Si. The Si layer 24 may have a thickness in a range of about 10-20 nm. FIG. 1D also shows, further in accordance with the exemplary embodiments, the selective etching of the Si layer 24 so that it remains as a thin layer only on the gate sidewalls, and has a thickness in a range of about 3-6 nm. Again, the etching stops on the high-k layer 16. Over the metal portions (the TiN portions 18) of the underlying gate structure the Si sidewall layer 24 is depleted, which is a desired outcome.

Figure 1E:
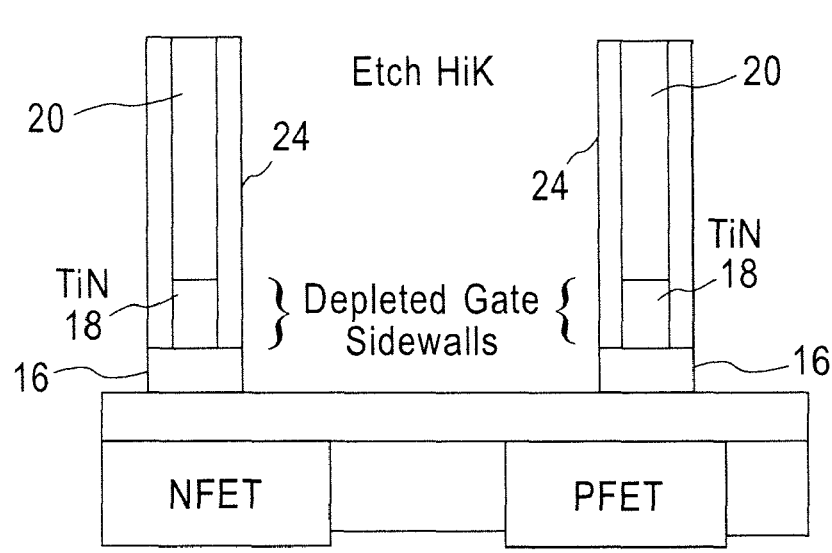
Figure 1E:
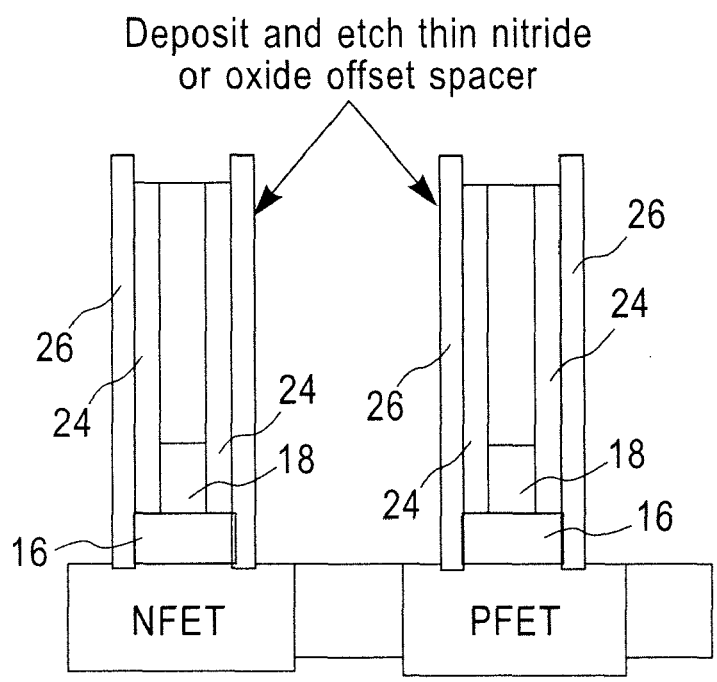

FIG. 1E shows the etching and removal of the high-k $HfO_2$ layer 16, except for that portion within each gate stack and underlying the TiN 18. Note that as a result of the removal of the high-k $HfO_2$ layer 16 a lateral extent of the remaining portion of the layer 16 of high dielectric constant material is greater than a lateral extent of the overlying layer 18 of metal. The remaining portion of the high-k $HfO_2$ layer 16 may be seen to resemble a pedestal-like structure that supports both the overlying metal layer 18, the amorphous or polycrystalline Si layer 20, and the amorphous or polycrystalline depleted Si sidewall layer 24.

As but one example a wet etch using a dilute hydrofluoric acid (DHF) solution may be used to remove the high-k $HfO_2$ layer 16, as described in an article "Etching of zirconium oxide, hafnium oxide, and hafnium silicates in dilute hydrofluoric acid solutions", Viral Lowalekar, Srini Raghavan, Materials Research Society, Vol. 19, #4, pgs. 1149-1156.

FIG. 1E also shows a result of depositing and etching a thin (e.g., about 3-6 nm) nitride or oxide offset spacer 26 that covers the Si layer 24 remaining on the gate sidewalls.

The remainder of the metal gate process flow may be conventional for CMOS processing, and can include providing oxide and/or nitride diffusion spacers and implants and final RTA.

Figure 1F:
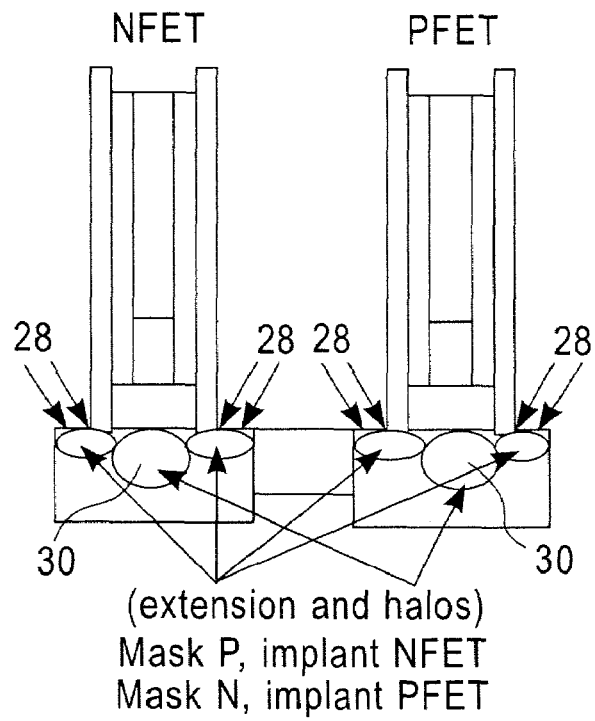
Figure 1G:
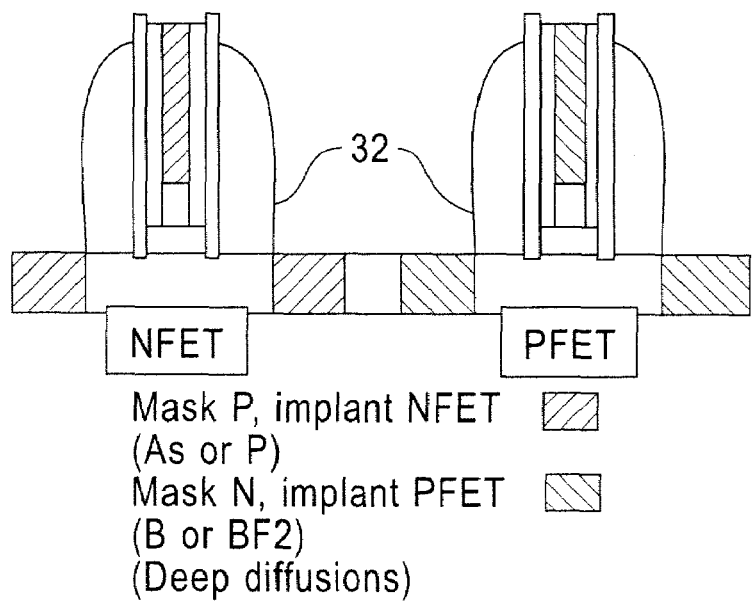

For example, FIG. 1F shows a result of selectively masking alternatively the NFET and PFET so as to implant the other to provide extensions 28 and halos 30, and FIG. 1G shows the result of the deposition and etching of a final spacer 32 (nitride or oxide deposited by PECVD), typically having a thickness of about 2-10 nm. FIG. 1G involves masking the PFET and implanting the NFET (using for example As or P), and masking the NFET and implanting the PFET (using for example B or $BF_2$). Subsequent annealing provides relatively deep diffusions for forming source and drain regions separated by the gate region. Subsequent processing may provide, in a conventional manner, silicide gates and diffusions (typically with Ni or Co) to complete the NFET and PFET transistors.

It may be appreciated that even if one were to experience an increase in extension resistance of about 6%, when applied to the NFET and the PFET this would translate into a resistance penalty on the order of about 1.4%, which is more than compensated for by the improvement in the Cmiller.

The exemplary embodiments of this invention can provide an undoped (intrinsic) Si gate sidewall 24 that doping in the main poly 20 may later diffuse into. The exemplary embodiments of this invention can also provide in-situ doped or implanted silicon (poly or amorphous) sidewalls 24, and both for the NFET and the PFET.

It can be appreciated that the MHK device fabrication processes discussed above are compatible with CMOS semiconductor processing methodology.

Various modifications and adaptations may become apparent to those skilled in the relevant arts in view of the foregoing description, when read in conjunction with the accompanying drawings and the appended claims. As but some examples, the use of other similar or equivalent MHK material systems may be attempted by those skilled in the art. However, all such and similar modifications of the teachings of this invention will still fall within the scope of this invention.

For example, it should be noted again that the exemplary embodiments of this invention are not limited for use with MHK gate structures comprised only of $HfO_2$ and TiN. As non-limiting examples, a $ZrO_2$ or a $HfSi_xO_y$ material may be used instead, as both exhibit a high dielectric constant (k of approximately 20-25) needed to provide a larger equivalent oxide thickness. In addition, the various layer thicknesses, material types, deposition techniques and the like that were discussed above are not be construed in a limiting sense upon the practice of this invention.

Furthermore, some of the features of the examples of this invention may be used to advantage without the corresponding use of other features. As such, the foregoing description should be considered as merely illustrative of the principles, teachings, examples and exemplary embodiments of this invention, and not in limitation thereof.

What is claimed is:

1. A method to reduce parasitic capacitance in a metal high dielectric constant (MHK) transistor, comprising:

forming a MHK gate stack upon a substrate, the MHK gate stack comprising a bottom layer comprised of high dielectric constant material, a middle layer comprised of metal, and a top layer comprised of one of amorphous silicon or polycrystalline silicon;

forming a single depleted sidewall layer on sidewalls of the MHK gate stack so as to overlie the middle layer and the top layer, said single depleted sidewall layer comprised of one of amorphous silicon or polycrystalline silicon; and forming an offset spacer layer over the single depleted sidewall layer and over exposed surfaces of the bottom layer, wherein the offset spacer layer is formed to be physically in contact with the single depleted sidewall layer and with the exposed surfaces of the bottom layer, wherein the offset spacer layer has a thickness in a range of about three to six nanometers.

2. The method of claim 1, where the bottom layer is comprised of at least one of $HfO_2$, $Ta_2O_5$, $TiO_2$, $Al_2O_3$, $Y_2O_3$ and $La_2O_5$.

3. The method of claim 1, where the middle layer is comprised of at least one of TiN, Ta, TaN, TaCN, TaSiN, TaSi, AlN, W and Mo.

4. The method of claim 1, where the metal high dielectric constant (MHK) transistor is one of a P-type FET or an N-type FET.

5. The method as in claim 1, where said single depleted sidewall layer has a thickness in a range of about 3 nm to about 6 nm.

6. The method as in claim 1, compatible with CMOS semiconductor processing methodology.

7. The method as in claim 1, further comprising forming a final spacer layer over the offset spacer layer.

8. The method as in claim 7, wherein the substrate comprises an underlying silicon layer underlying the high dielectric constant material, and wherein the method further comprises, prior to forming the final spacer layer, forming extensions and halos in the underlying silicon layer.

9. The method as in claim 8, further comprising, after forming the final spacer layer, forming source and drain regions in the underlying silicon layer.

10. The method as in claim 7, wherein forming extensions further comprises forming the extensions so that the extensions at least partially underlie the single sidewall layer.

11. The method as in claim 1, wherein forming the single depleted sideway layer further comprises forming the single depleted sideway layer to have a thickness in a range of about three to six nanometers.

* * * * *

UNITED STATES PATENT AND TRADEMARK OFFICE
CERTIFICATE OF CORRECTION

| | | |
|---|---|---|
| PATENT NO. | : 7,855,135 B2 | Page 1 of 1 |
| APPLICATION NO. | : 12/539860 | |
| DATED | : December 21, 2010 | |
| INVENTOR(S) | : Chang et al. | |

It is certified that error appears in the above-identified patent and that said Letters Patent is hereby corrected as shown below:

Title Page, item (54) and Col. 1

Please delete the Title "METHOD TO REDUCE PARASTIC CAPACITANCE IN A METAL HIGH DIELECTRIC CONSTANT (MHK) TRANSISTOR" and insert -- METHOD TO REDUCE PARASITIC CAPACITANCE IN A METAL HIGH DIELECTRIC CONSTANT (MHK) TRANSISTOR --.

Signed and Sealed this
Nineteenth Day of April, 2011

David J. Kappos
*Director of the United States Patent and Trademark Office*